(12) United States Patent
Miyauchi et al.

(10) Patent No.: US 9,059,706 B2
(45) Date of Patent: Jun. 16, 2015

(54) DRIVE CIRCUIT FOR SWITCHING ELEMENT

(75) Inventors: Syun Miyauchi, Chiryu (JP); Tsuneo Maebara, Nagoya (JP); Yoshiyuki Hamanaka, Kariya (JP); Ryotaro Miura, Aichi-ken (JP)

(73) Assignee: DENSO CORPORATION, Kariya (JP)

( * ) Notice: Subject to any disclaimer, the term of this patent is extended or adjusted under 35 U.S.C. 154(b) by 132 days.

(21) Appl. No.: 13/406,948

(22) Filed: Feb. 28, 2012

(65) Prior Publication Data

US 2012/0217937 A1 Aug. 30, 2012

(30) Foreign Application Priority Data

Feb. 28, 2011 (JP) ................. 2011-041650

(51) Int. Cl.
*H02H 7/08* (2006.01)
*H03K 17/18* (2006.01)
*H03K 17/082* (2006.01)

(52) U.S. Cl.
CPC ............ *H03K 17/18* (2013.01); *H03K 17/0828* (2013.01)

(58) Field of Classification Search
USPC .......... 318/722, 400.17, 400.21, 400.26, 127, 318/146, 265, 286, 366, 369, 433
See application file for complete search history.

(56) References Cited

U.S. PATENT DOCUMENTS

| 2005/0046405 A1* | 3/2005 | Trafton et al. ................ 323/308 |
| 2009/0091518 A1* | 4/2009 | Lee ................................ 345/60 |
| 2010/0097031 A1* | 4/2010 | King et al. .................... 320/109 |

FOREIGN PATENT DOCUMENTS

| JP | 11-87909 | 3/1999 |
| JP | 3558324 | 5/2004 |

* cited by examiner

*Primary Examiner* — Paul Ip
*Assistant Examiner* — Iftekhar Mustafa
(74) *Attorney, Agent, or Firm* — Nixon & Vanderhye P.C.

(57) ABSTRACT

A drive circuit is used for driving a switching element. The drive circuit includes a detection unit and an integrated circuit. The detection unit detects a state of a controlled switching element and outputs a voltage signal corresponding to a detection result of the state. The integrated circuit receives the voltage signal via an input terminal for the detection result and controls the switching element based on the received voltage signal. The input terminal includes at least two input terminals that are connected to each other so as to receive the same voltage signal from the detection unit.

5 Claims, 4 Drawing Sheets

DRIVE CIRCUIT FOR SWITCHING ELEMENT

CROSS-REFERENCE TO RELATED APPLICATION

This application is based on and claims the benefit of priority from earlier Japanese Patent Application No. 2011-041650 filed Feb. 28, 2011, the description of which is incorporated herein by reference.

BACKGROUND OF THE INVENTION

1. Technical Field of the Invention

The present invention relates to a drive circuit for a switching element, and in particular, to a drive circuit which controls a switching element targeted for being driven.

2. Related Art

This type of drive circuit is well known. For example, a patent document JP-3558324-B discloses a gate driving device. In the gate driving device, a Zener diode and a transistor are connected between the emitter and the gate of an insulated gate bipolar transistor (IGBT) to clamp the gate voltage to a predetermined level. The transistor is turned on when a detection value (voltage signal) of the collector current of the IGBT exceeds a threshold voltage. Thus, when it is judged that the collector current of the IGBT shows a value that may impair the reliability of the IGBT, the gate voltage can be clamped to a specified value, and further, the collector current can be limited.

Further, recently, power conversion circuits, such as on-vehicle inverters, deal with high current. In order to cope with high current, power conversion circuits in which a plurality of switching elements are arranged in parallel (parallel connected) have been developed and put into practical use. Using such a power conversion circuit, the current that can be dealt with is multiplied. Use of such a parallel connection may however involve detection of the collector current for each of the switching elements.

On the other hand, it is well known that an integrated circuit is used to configure a means for performing drive control of switching elements, or for clamping gate voltage. When such an integrated circuit is used for the parallel connected switching elements as mentioned above, the integrated circuit is required to have a plurality of terminals for inputting detection values of the respective collector currents.

In order to ensure universal use, an integrated circuit may be configured on the assumption of the use of the parallel connection mentioned above, and may be utilized even if the parallel connection is not actually used. When the integrated circuit is used for the case not using the parallel connection, some of the terminals for inputting detection values of the collector currents remain unused. The terminals not in use may be grounded (so as to have the same potential as that of the emitter of the IGBT), as disclosed in a patent document JP-H11-087909-A. Thus, the voltage of each of the terminals not in use is prevented from exceeding the threshold voltage and thus the function of clamping the gate voltage will not be exerted.

However, in the mode mentioned above, i.e., when the integrated circuit assumed to use parallel connection is utilized for the case not using the parallel connection, the occurrence of short circuit may raise a problem. Specifically, when short circuit occurs, for some reason, between the terminals for inputting detection values of the respective collector currents, the potentials of the terminals to which detection values of the collector currents are actually inputted are tend to be fixed to the ground potential. In this case, when the collector current becomes excessively large, the gate voltage cannot be clamped.

SUMMARY

The present disclosure has been made in light of the problems set forth above and provides a drive circuit for a switching element which is able to enhance the reliability of drive control of switching elements targeted for being driven, under the condition that a general-purpose integrated circuit is used.

According to an exemplary aspect of the present disclosure, there is provided a drive circuit for driving a switching element, comprising: a detection unit that detects a state of a switching element targeted for being driven and outputs a voltage signal corresponding to a detection result of the state; an integrated circuit that receives the voltage signal via an input terminal and performs drive control of the switching element based on the received voltage signal, the input terminal including at least two input terminals that are connected to each other so as to input the same voltage signal from the detection unit.

In the above disclosure, the at least two input terminals are redundantly designed and then, the number of switching elements targeted for being driven by a single integrated circuit can be changed, and further, the integrated circuit can be used for general purposes. In addition, since the number of switching elements actually driven by the single integrated circuit is smaller than the maximum number of switching elements that can be driven, at least one input terminal to be not used (hereinafter referred to as a "non-used input terminal", i.e., excessive input terminal) can be connected to at least one input terminal to be used (hereinafter referred to as a "used input terminal"). Thus, the same voltage signal is inputted to the non-used input terminal and the used input terminal. In this way, the drive control of the switching elements targeted for being driven is not affected by occurrence of an abnormality event that a short circuit occurs between the non-used input terminal and the used input terminal.

In the drive circuit, the integrated circuit may include: a judgment unit that judges whether or not an abnormality of driving of the switching element occurs based on the same voltage single inputted via the at least two input terminals; and a restriction unit that restricts driving of the switching element, if the judgment unit judges that the abnormality occurs.

In the above disclosure, the voltage signal is used for determining whether or not an abnormality occurs in the switching element targeted for being driven. If it is determined that the abnormality occurs, the driving of the switching element is limited. Here, if a short circuit occurs between the non-used input terminal and the used input terminal, the voltage signal inputted via the used terminal may indicate inappropriate value, and then, in spite of occurrence of the abnormality, there is a probability that the driving of the switching elements is not limited. Therefore, it is particularly useful to mutually connect the at least two input terminals for the detection result.

In the drive circuit, the voltage signal outputted by the detection unit may have a positive correlation with a current that flows in the switching element; and the judgment unit may judge that an abnormality occurs in the switching element, if the voltage signal is larger than a predetermined threshold voltage.

In the drive circuit, the switching element may be a voltage-controlled switching element; and the voltage signal outputted by the detection unit may be a potential difference between an open/close control terminal of the switching element and either one of ends of a path where a current of the switching element flows.

In the drive circuit, the detection unit may include a constant current source that is located at the outside of the integrated circuit, and a temperature sense diode that is located in the vicinity of the switching element; and the judgment unit may judge that an abnormality occurs in the switching element, if an anode voltage of the temperature sense diode is a predetermined threshold voltage or less.

In the drive circuit, the integrated circuit may not be provided with means for fixing a potential in an open state where the at least two terminals are not connected to a signal line for inputting the voltage signal.

In the above disclosure, the integrated circuit is not provided with means for fixing the potential of the at least two input terminals. Thus, the variation in the detection value of the voltage signal can be easily suppressed, whether the at least two input terminals are mutually connected or not.

DETAILED DESCRIPTION OF THE PREFERRED EMBODIMENTS

With reference to the accompanying drawings, hereinafter are described some embodiments of a drive circuit for a switching element, according to the present invention.

First Embodiment

Hereinafter, referring to FIGS. 1 and 2, a first embodiment is described. In the first embodiment, a drive circuit for a switching element according to the present invention is applied to a power conversion circuit connected to a vehicle's main machine mounted on a vehicle.

Figure 1:
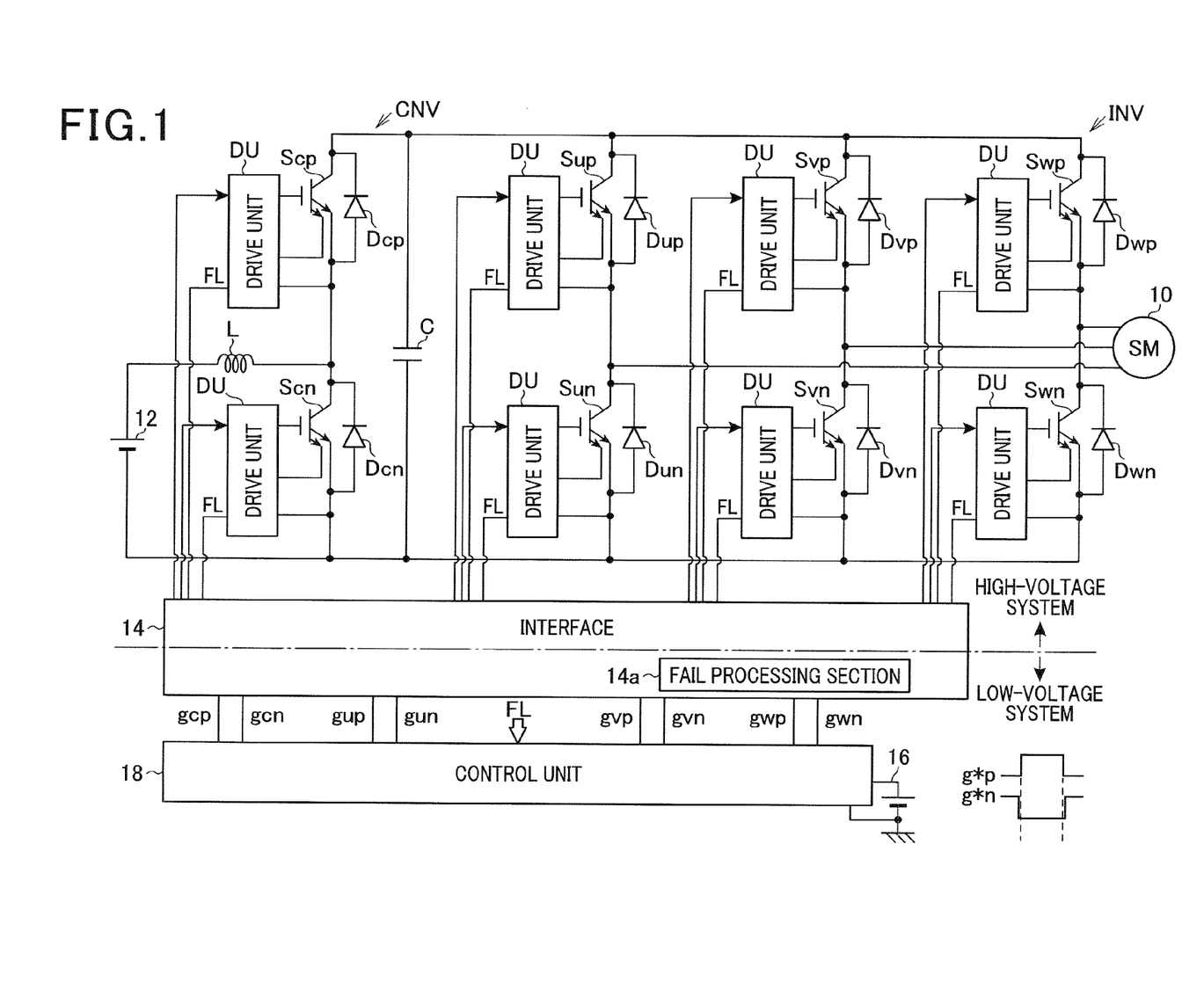
FIG. 1 is a schematic diagram illustrating a configuration of a system according to a first embodiment of the present invention.

FIG. 1 is a diagram illustrating a general configuration of a control system (motor system) for a vehicle's main machine, according to the present embodiment. A motor generator 10 is a vehicle's main machine which is mechanically connected to drive wheels of a vehicle, not shown. The motor generator 10 is also connected to a high-voltage battery 12 via an inverter INV and a step-up converter (also called a boost converter) CNV, which compose a power conversion circuit.

The step-up converter CNV includes a capacitor C, a pair of switching elements Scp and Scn, and a reactor L. The pair of switching elements Scp and Scn are connected parallel to the capacitor C. The reactor L connects the connecting point of the pair of switching elements Scp and Scn to the positive pole of the high-voltage battery 12. When the switching elements Scp and Scn are turned on/off, the voltage of the high-voltage battery 12 (e.g., 100 V or more) is stepped up, with a predetermined voltage (e.g., 666 V) as an upper limit.

The inverter INV includes a serial connection of switching elements Sup and Sun, a serial connection of switching elements Svp and Svn and a serial connection of switching elements Swp and Swn. The connecting points of these respective serial connections are connected to respective U, V and W phases of the motor generator 10. In the present embodiment, insulated gate bipolar transistors (IGBTs) are used as these switching elements S*# (*=u, v, w, or c; #=p or n). The switching elements S*# are in anti-parallel connection with respective diodes (free-wheel diodes) D*#.

A control unit 18 is a control unit using a low-voltage battery 16 as a power supply and controls the motor generator 10. The control circuit 18 operates the inverter INV and the step-up converter CNV to desirably control the controlled variable of the motor generator 10. Specifically, the control unit 18 outputs manipulated signals gcp and gcn to drive units DU to control the switching elements Scp and Scn, respectively, of the step-up converter CNV. Further, the control unit 18 outputs manipulated signals gup, gun, gyp, gvn, gwp and gwn to drive units DU to control the switching elements Sup, Sun, Svp, Svn, Swp and Swn, respectively, of the inverter INV. The manipulated signals g*p on high-potential side are complementary to the corresponding manipulated signals g*n on low-potential side. In other words, the switching elements S*p on high-potential side and the corresponding switching elements S*n on low-potential side are alternately turned on.

A high-voltage system including the high-voltage battery 12 and a low-voltage system including the low-voltage battery 16 are insulated from each other. Signals are transmitted/received between these systems via an interface 14 that includes an insulating element, such as a photocoupler.

Figure 2:
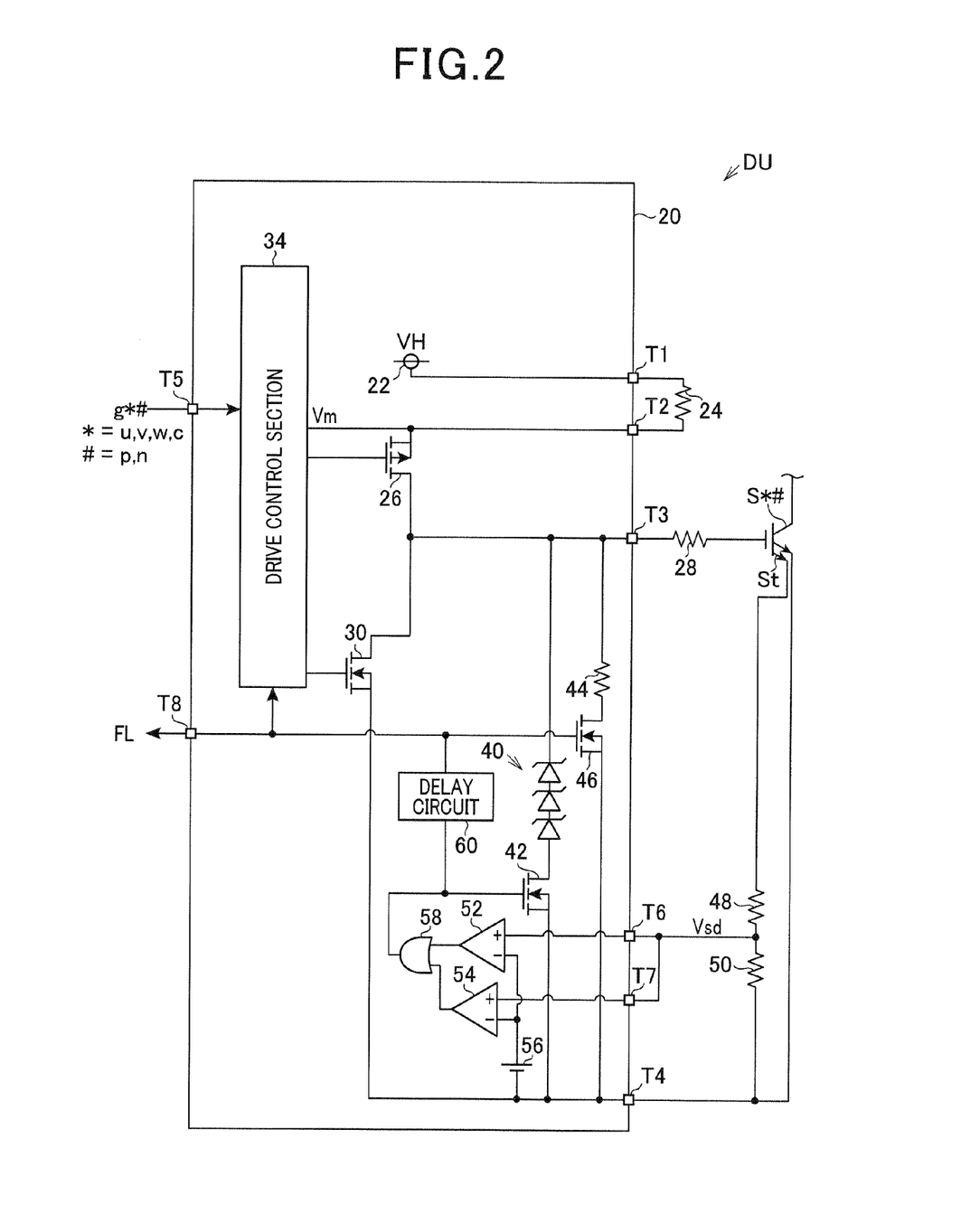
FIG. 2 is a circuit diagram illustrating a circuit configuration of a drive unit according to the first embodiment.

FIG. 2 is a circuit diagram illustrating a configuration of one of the drive units DU.

As shown in FIG. 2, the drive unit DU includes a drive IC 20 that is a semiconductor integrated circuit designed for a single chip. The drive IC 20 includes a DC (direct current) voltage source 22 having a terminal voltage VH. A terminal of the DC voltage source 22 is connected to an open/close control terminal (gate) of the switching element S*# via a terminal T1, a constant-current resistor 24, a terminal T2, a p-channel MOSFET (metal-oxide-semiconductor field-effect transistor) (constant-current switching element 26), a terminal T3 and a gate resistor 28.

On the other hand, the terminal T3 is connected to a terminal T4 via an n-channel MOSFET (discharge switching element 30). The terminal T4 is connected to an output terminal (emitter) of the switching element S*#.

The constant-current switching element 26 and the discharge switching element 30 are operated by a drive control section 34 in the drive IC 20. Specifically, the drive control section 34 alternately turns on/off the constant-current switching element 26 and the discharge switching element 30 based on the manipulated signal g*# inputted via a terminal T5 to thereby drive the switching element S*#. More specifically, when the manipulated signal g*# is a turn-on command, the drive control section 34 turns off the discharge switching element 30 and turns on the constant-current switching element 26. On the other hand, when the manipulated signal g*# is a turn-off command, the drive control section 34 turns off the constant-current switching element 26 and turns on the discharge switching element 30.

In the period when the constant-current switching element 26 is turned on, the voltage applied to the open/close control terminal (gate) is operated such that the amount of voltage drop (voltage Vm of the terminal T2) of the constant-current resistor 24 is controlled to be a specified value. Thus, the current passing through the constant-current resistor 24 is rendered to be constant. In addition, the gate of the switching element S*# can be charged under constant current control.

Under the constant current control using the constant-current switching element 26, the gate voltage of the switching element S*# converges on the terminal voltage VH of the DC voltage source 22. When the gate voltage approximates a conversion value, the controllability of the constant current control is lowered. The reason for this is as follows. Specifically, a gate voltage Vge will have a value equal to or more than a value obtained by subtracting an amount of voltage drop of the constant-current resistor 24 and a minimum amount of voltage drop of the constant-current switching element 26 from the terminal voltage VH. Then, depending on the control of the gate voltage by the constant-current switching element 26, the amount of voltage drop of the constant-current resistor 24 can no longer be controlled to a specified value. Therefore, the terminal voltage VH is set to a value that will not lower the controllability of the constant current control, until the gate voltage reaches a level at which a maximum current that is a saturation current passes through the switching element S*# in a state where the switching element S*# is normally driven.

Further, the terminal T3 is connected to the terminal T4 via a serial connection of a Zener diode 40 and a clamp switching element 42. The Zener diode 40 has a breakdown voltage that limits the gate voltage of the switching element S*# to an extent that an excessive current will not pass through the switching element S*#.

Furthermore, the terminal T3 is connected to the terminal T4 via a soft shutdown resistor 44 and a soft shutdown switching element 46.

On the other hand, the switching element S*# includes a sense terminal St. The sense terminal St outputs minute current having a correlation with the current (collector current) that passes between an input terminal (collector) and an output terminal (emitter) of the switching element S*#. Also, the sense terminal St is electrically connected to the emitter of the switching element S*# via a serial connection of resistors 48 and 50. Thus, the current outputted from the sense terminal St causes voltage drop in the resistor 50. The amount of voltage drop in the resistor 50 can be regarded as being an electrical state quantity that has a correlation with the current passing between the input terminal and the output terminal of the switching element S*#.

The voltage drop (voltage Vsd at a connecting point of the resistors 48 and 50) in the resistor 50 is applied to a non-inverting input terminal of a comparator 52 via a terminal T6 as well as to a non-inverting input terminal of a comparator 54 via a terminal T7. On the other hand, a reference voltage Vref of a reference power supply 56 is applied to the inverting input terminals of the comparators 52 and 54. Thus, when the current passing between the collector and the emitter of the switching element S*# becomes equal to or more than an overcurrent threshold Ith, the output signals of the comparators 52 and 54 are inverted from logical "L (low level)" to logical "H (high level)".

Signals indicating logical "H" outputted from the comparators 52 and 54 are applied to the clamp switching element 42 via an OR circuit 58, while also being applied to a delay circuit 60. When a signal indicating logical "H" is inputted to the delay circuit 60 for a predetermined period, the delay circuit 60 outputs a fail signal FL. The fail signal FL turns on the soft shutdown switching element 46 to forcibly turn off the switching element S*#, or instructs the drive control section 34 to stop the driving of the constant-current switching element 26 and the discharge switching element 30.

With the configuration as set forth above, when overcurrent flows through the switching element S*#, the clamp switching element 42 is turned on first to turn on the Zener diode 40, thereby reducing the gate voltage of the switching element S*#. Thus, the current (collector current) passing through the switching element S*# can be limited. After that, when the overcurrent continues for a predetermined period, the soft shutdown switching element 46 is turned on, thereby forcibly turning off the switching element S*#.

In this way, when the collector current becomes equal to or more than the overcurrent threshold Ith for not less than a predetermined period, the soft shutdown switching element 46 is turned on, and thus the electric charges of the switching element S*# are discharged via the soft shutdown resistor 44 and the gate resistor 28. The soft shutdown resistor 44 increases the resistance of a discharge path. The resistance is increased based on a concept of avoiding an undue surge under the condition where the collector current is excessively large. Specifically, under such a condition, the undue surge would be caused upon increase of the speed of switching the switching element S*# from an on-state to an off-state, or, upon increase of the speed of shutting down between the collector and the emitter. Therefore, under the condition where the collector current is likely to become equal to or more than the overcurrent threshold Ith, the gate of the switching element S*# is discharged via a path whose resistance is larger than that of the discharge path including the gate resistor 28 and the discharge switching element 30.

In the present embodiment, the clamp circuit including the clamp switching element 42 and the Zener diode 4 has a clamp voltage which is set to a value for limiting the current passing through the switching element S*# to not more than a specified value (≥overcurrent threshold Ith). The fail signal FL is outputted to the low-voltage system (control unit 18) via a terminal T8. Upon reception of the fail signal FL, a fail processing section 14a shown in FIG. 1 shuts down the inverter INV and the step-up converter CNV. The fail processing section 14a may have a configuration shown such as in FIG. 3 of JP-2009-060358-A.

The drive IC 20 of the present embodiment has one or two switching elements S*# as targets of driving. Depending on whether the number of the target switching elements S*# is one or two, the current outputted from the terminal T3 (gate charging speed) is adjusted. To this end, the resistor 24 is externally provided to the drive IC 20 and the resistance is adjusted. Further, in order to adjust the current inputted from the terminal T3 (gate discharging speed), the gate resistor 28 is externally provided to the drive IC 20 and the resistance is adjusted. In order to cope with the case where two switching elements S*# are connected to the terminal T3, there is a pair of input terminals T6 and T7 to which the voltage Vsd is applied. When it is judged that a current flowing in at least one of the terminals T6 and T7 exceeds the overcurrent threshold Ith, the current passing through the switching elements S*# is limited.

However, if a single switching element S*#, or a single gate, is connected to the terminal T3, any one of the terminals T6 and T7 is not fundamentally used. Thus, if the terminal T7 is connected to the ground (emitter of the switching element S*#), the comparator 54 will not be inverted to logical "H". In this case, however, if short circuit occurs between the terminals T6 and T7, the comparator 52 keeps outputting logical "L" even if the amount of voltage drop (voltage Vsd) of the resistor 50 is equivalent to the overcurrent threshold Ith.

In this regard, in the present embodiment, the terminals T6 and T7 are short circuited (connected with low impedance) so as to have the same potential. Thus, both of the terminals T6 and T7 are applied with a detected voltage signal (voltage Vsd) of the collector current of the single switching element S*#. As a result, the situation as mentioned above can be avoided.

According to the present embodiment specifically described above, the following advantages are obtained.

(1) The detection results input terminals (terminals T6 and T7) for inputting the detection results of an identical physical quantity of the drive IC 20 are short circuited to impart the terminals with the same potential. Thus, the drive control of the switching elements S*# will not be affected by occurrence of an abnormality situation that causes a short circuit between these terminals.

(2) The detection results input terminals (T6 and T7) are ensured not to be provided therein with a means for fixing the potential in an open state where these terminals are not connected to a signal line for inputting voltage signals. In this case, comparing with the case where, for example, the terminals T6 and T7 are pulled down to the terminal T4 via a resistor to provide a potential fixing means, and the detection values of the voltage Vsd are not varied, whether the terminals T6 and T7 are short circuited or not. Thus, the accuracy of detecting the voltage Vsd is prevented from being lowered.

Second Embodiment

Figure 3:
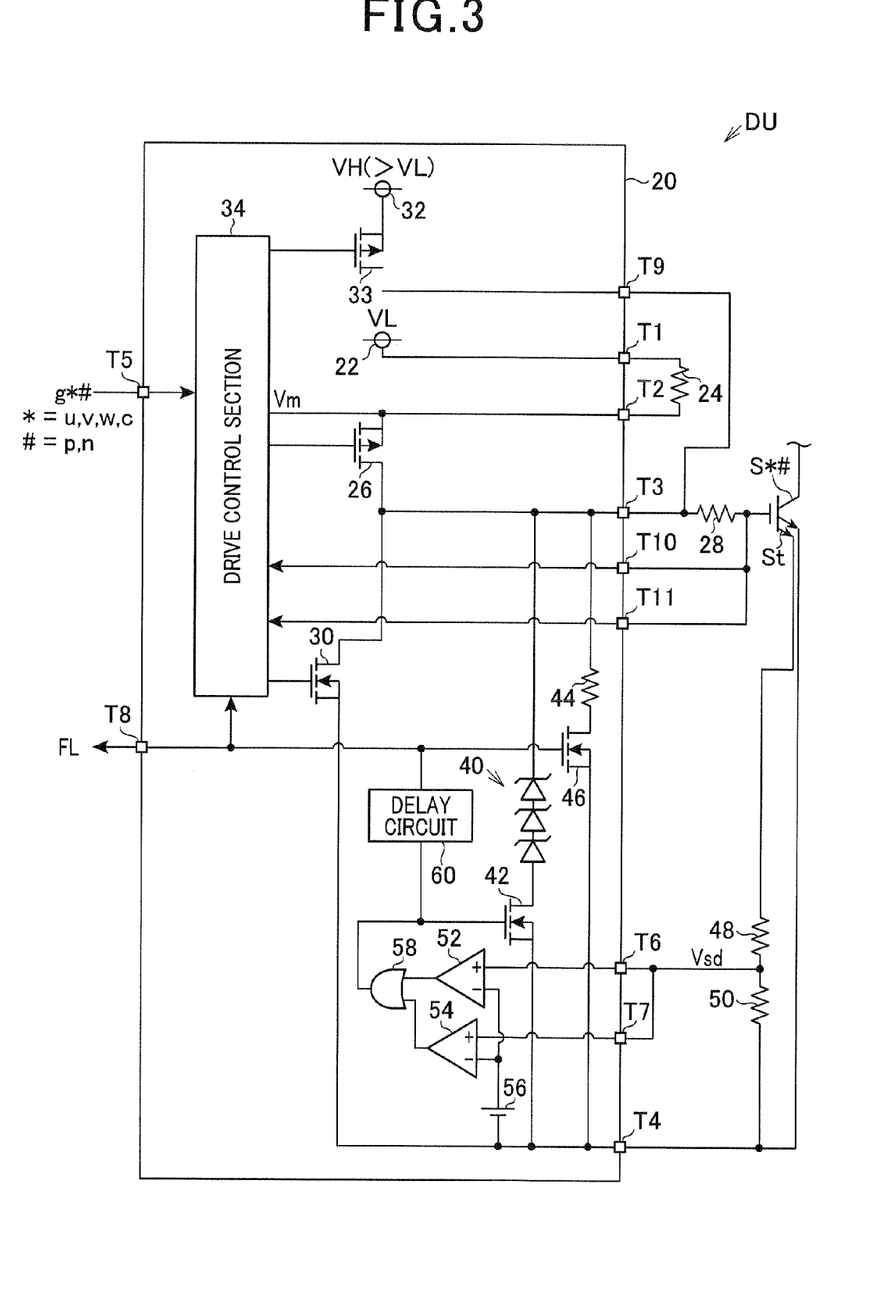
FIG. 3 is a circuit diagram illustrating a circuit configuration of a drive unit according to a second embodiment of the present invention.

Referring to FIG. 3, hereinafter is described a second embodiment, focusing on the differences from the first embodiment. It should be appreciated that in the second and the subsequent embodiments, the components identical with or similar to those in the first embodiment are given the same reference numerals for the sake of omitting unnecessary explanation.

FIG. 3 is a diagram illustrating a configuration of the drive unit DU. In the present embodiment, a terminal voltage VL of the DC voltage source 22 is set to a voltage lower than the gate voltage having a lower limit of current as a saturation current, which tends to impair the reliability of the switching element S*#. Besides this, the drive unit DU includes a DC voltage source 32 having a terminal voltage VH larger than the terminal voltage VL. The DC voltage source 32 is connected to the gate resistor 28 via a constant-voltage switching element 33 and a terminal T9.

Thus, in turning on the switching element S*#, the gate is charged first under the constant current control. Then, under the condition where the logical product of the lapse of Miller period and the lapse of a specified time becomes true, the constant-current switching element 26 is turned off and the constant-voltage switching element 33 is turned on to apply the terminal voltage VH to the gate of the switching element S*#. This is to avoid flow of an excessively large current through the switching element S*#, in turning on the switching element S*#.

Specifically, when an excessively large current flows through the switching element S*# when it is turned on, the response from the clamp switching element 42 tends not to be given in time. In this regard, in the present embodiment, the current passing through the switching element S*# is limited by the terminal voltage VL of the DC voltage source 22, unless the constant-voltage switching element 33 is turned on. The specific time mentioned above is set to a time equal to or more than the time required for the clamp switching element 42 to make a response.

Whether the Miller period has passed or not is determined based on the voltage across the gate and the emitter (gate voltage) of the switching element S*#, which voltage is obtained via terminals T10 and T11. The provision of the pair of the terminals T10 and T11 copes with the drive IC 20's capability of driving two switching elements at the most. Further, the reason why the pair of the terminals T10 and T11 are short circuited is that the number of the switching elements S*# actually targeted for being driven is one in the present embodiment.

Third Embodiment

Figure 4:
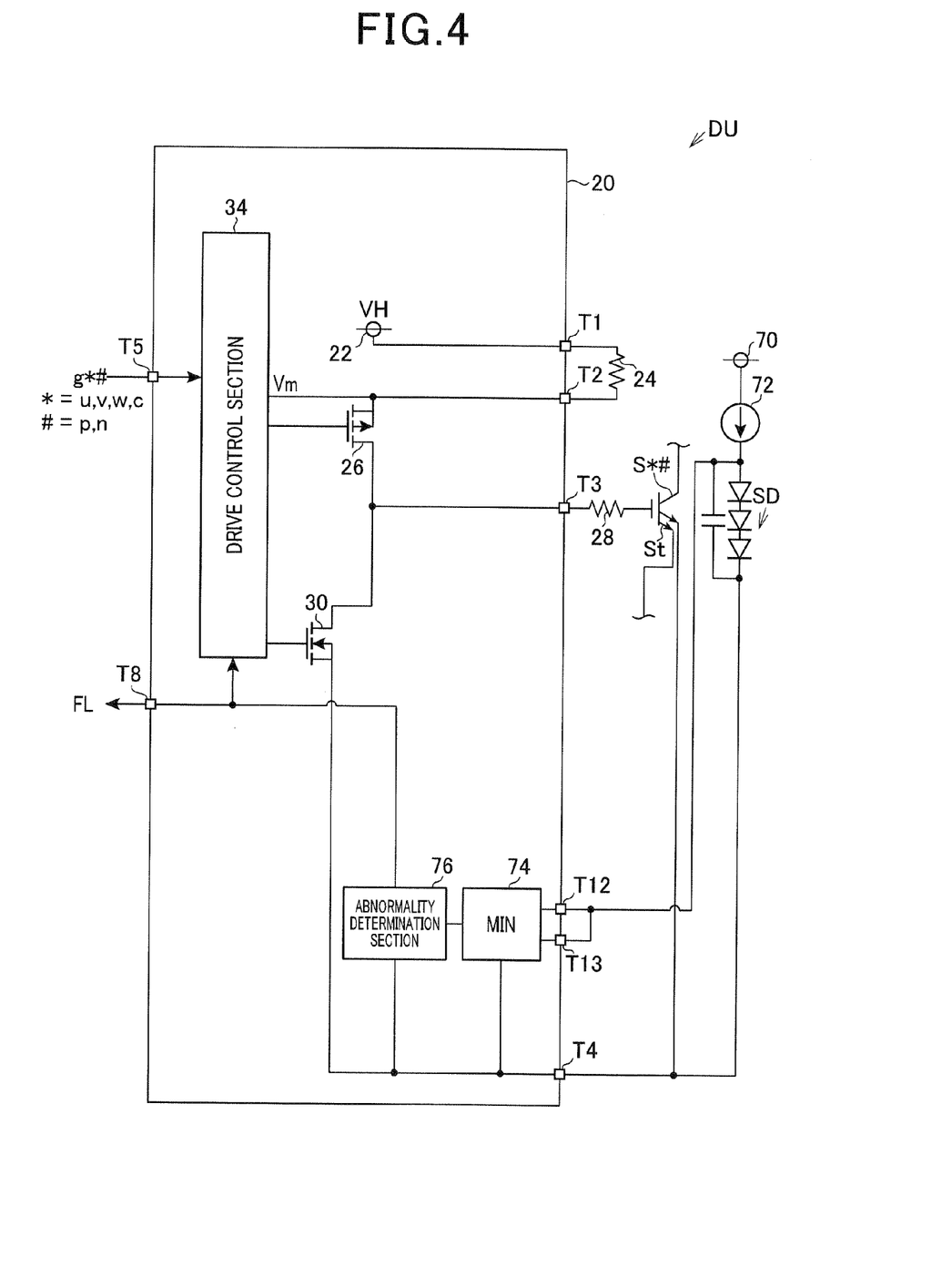
FIG. 4 is a circuit diagram illustrating a circuit configuration of a drive unit according to a third embodiment of the present invention.

Referring to FIG. 4, hereinafter is described a third embodiment, focusing on the differences from the first embodiment.

FIG. 4 is a diagram illustrating a configuration of the drive unit DU.

In the present embodiment, as shown in FIG. 4, the drive unit DU includes a temperature sensitive diode SD for detecting the temperature of the switching element S*#. The temperature sensitive diode SD is supplied, via a constant current source 72, with electric charges from a DC voltage source 70 which is externally provided to the drive IC 20. The temperature sensitive diode SD has a cathode connected to the terminal T4 and an anode connected to terminals T12 and T13. Thus, voltage signals, i.e., results of temperature detection by the temperature sensitive diode SD, are applied to the terminals T12 and T13.

The voltages of the terminals T12 and T13 are applied to an abnormality determination section 76 via a minimum value calculation circuit 74. Specifically, smaller one of the voltages of the terminals T12 and T13 is applied to the abnormality determination section 76. The abnormality determination section 76 determines whether or not the temperature detected by the temperature sensitive diode SD is so excessively high as to impair the reliability of the switching element S*#. If the temperature is determined to be excessively high, a fail signal FL is outputted. The reason why the minimum value calculation circuit 74 is used here is to determined the presence/absence of a failure using a higher temperature when the drive IC 20 has two switching elements S*# targeted for being driven. This is based on the fact that the anode voltage of the temperature sensitive diode SD has a negative correlation with the temperature.

In the present embodiment, a single switching element S*# is driven using the drive IC 20 capable of driving two targets. Therefore, the terminals T12 and T13 are short circuited to impart them with the same potential. Also, in the present embodiment, the constant current source 72 is externally provided to the drive IC 20. This is to avoid change of the correlation of the anode voltage of the temperature sensitive diode SD with the temperature by short circuiting the terminals T12 and T13.

Specifically, let us discuss the case where the terminals T12 and T13 have the respective constant current sources 72 in the drive IC 20. In this case, the relationship of the anode voltage of the temperature sensitive diode SD with the temperature will be different between the case where a single sensitive diode SD is connected to the short circuited terminals T12 and T13 and the case where the terminals T12 and T13 are connected to the respective temperature sensitive diodes SD.

(Modifications)

The embodiments described above may be modified and implemented as follows.

(1) In the first embodiment described above, the "restriction unit" includes: the clamp circuit having the Zener diode 40 and the clamp switching element 42; the soft shutdown switching element 46; and a means for outputting a turn-off command to the drive control section 34. Alternative to this, the limiting unit may include at least one of these components. Alternatively, the restriction unit may have a function of forcibly turning on the discharge switching element 30.

(2) In the second embodiment described above, the "determination unit" may determine the presence/absence of a failure in the constant current control, based on the potential difference between the terminals T3 and T10 and the potential difference between the terminals T3 and T11 under the constant current control. This is based on the theory that, when constant current flows through the gate resistor 28, the amount of voltage drop in the gate resistor 28 is constant. (Refer to the "method of using gate voltage" at item (8) set forth below.)

(3) The detection unit is not limited to the one exemplified in the above embodiments. The details of this are set forth at item (2) concerning "determination unit".

(4) The above embodiments have been described on the premise of not being provided with the "means for fixing potential of a terminal in an integrated circuit". However, this should not impose a limitation. For example, in the third embodiment described above, when the drive IC 20 is provided therein with the DC voltage source 70 and the constant current source 72, the potential of the terminal T13 may be fixed by the DC voltage source 70 in an open state where the temperature sensitive diode SD is not connected to the terminal T13. However, in this case as well, the current passing through the temperature sensitive diode SD is doubled when the terminals T12 and T13 are short circuited, and thus the correlation between the output voltage of the temperature sensitive diode SD and the temperature cannot be predicted. Therefore, as exemplified in the third embodiment (FIG. 4), it is effective to establish a connection between the terminals T12 and T13. However, in this case, the current of the constant current source provided in the integrated circuit is required to be externally controlled, so that the current passing through the temperature sensitive diode SD will not be varied due to the presence/absence of parallel connection.

(5) Also, in the first embodiment, for example, the terminals T6 and T7 may be connected, in the drive IC 20, to the terminal T4 via a resistor. In this case, depending on the resistance, the variation in the detection values of the voltage Vsd resulting from the short circuiting between the terminals T6 and T7 may be neglected. Further, in this case, resistors may be provided for the respective terminals T6 and T7 so that each of the resistors is located between each of these terminals T6 and T7 and the connecting point of the resistors 48 and 50, thereby suppressing the variation in the detection values.

(6) The "method of connecting detection results input terminals" is not limited to the one for short circuiting these input terminals. Alternative to this, for example, these terminals may be connected to the detection unit (e.g., the connecting point of the resistors 48 and 50 of FIG. 3) via the respective resistors having the same resistance.

(7) The "method of using anode voltage of the temperature sensitive diode SD" may not necessarily be used for determining a failure. Alternatively, the method may be used as a means for acquiring temperature information to be outputted such as to the control unit 18.

(8) The "method of using gate voltage" is not limited to the one used in the second embodiment. Alternative to this, the occurrence of a failure in driving the gate may be determined based on the gate voltage's being low after lapse of a specified time from the turn-on operation.

(9) The "number of switching elements targeted for being driven by a single integrated circuit" is not limited to one or two. Alternatively, three or more switching elements may be ensured to be targeted. In this case, when the number of switching elements actually targeted for being driven is one, all of the detection results input terminals corresponding to the switching elements remained unused are connected to the detection results input terminal corresponding to the single switching element targeted for being driven. Further, for example, let us assume the case where a drive circuit is capable of targeting three or more switching elements, but the number of switching elements actually targeted for be driven is smaller than this by one. In this case, the detection results inputting terminal of the single switching element remained unused is connected to any one of the detection results input terminals of the respective switching elements targeted for being driven.

(10) The "switching elements targeted for being driven" are not limited to IGBTs, but power MOSFETs may be usable. The power MOSFETs may be not only n-channel MOSFETs but also p-channel MOSFETs. However, in this case, each power MOSFET is turned on when the potential of the open/close control terminal (gate potential) is lowered with respect to the potential at either one of the ends (source potential) of the current flow path. Accordingly, each of the switching elements targeted for being driven is turned on when "negative" electric charges are charged to the gate.

(11) The "power conversion circuit composed of switching elements targeted for being driven" used in the above embodiments has been a DC conversion circuit (inverter INV) including high-potential side switching elements and low-potential side switching elements to selectively connect the terminal of a rotary machine to the positive and negative poles of a DC power supply, and the converter CNV including a high-potential side switching element and a low-potential side switching element. Alternative to this, the conversion circuit may be a step-down converter which steps down the voltage of the high-voltage battery 12 for application to the low-voltage battery 16. In this case as well, the converter, if it includes serial connections of high-potential side switching elements and low-potential side switching elements, can effectively make use of the overcurrent protective function.

(12) The process of charging electric charges for turning on the switching element S*# is not limited to the one based on the constant current control. For example, the process of charging may be conducted by limiting the charging current that flows through a loop path by means of a resistor as a linear element. In this case, the loop path includes the open/close control terminal of the switching element S*# and a DC voltage source.

(13) The process of discharging electric charges for turning on the switching element S*# may be conducted under the constant current control.

(14) In the first embodiment described above, the voltage across the terminals T4 and T6 and the voltage across the terminals T4 and T7 may be converted by a differential amplifier circuit and inputted to the comparators 52 and 54, respectively.

(15) The motor generator 10 is not limited to the vehicle's main machine, but may be a generator installed in a series hybrid vehicle.

The present invention may be embodied in several other forms without departing from the spirit thereof. The embodiments and modifications described so far are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A drive circuit for driving a switching element, comprising:
   a detection unit that detects a state of a switching element targeted for being driven and outputs a voltage signal corresponding to a detection result of the state; and
   an integrated circuit that receives the voltage signal via an input terminal for the detection result and performs drive control of the switching element based on the received voltage signal, the input terminal including at least two input terminals that are connected to each other so as to receive the same voltage signal from the detection unit, wherein:
   the integrated circuit includes:
      a judgment unit that judges whether or not an abnormality of driving of the switching element occurs based on the same voltage single inputted via the at least two input terminals; and
      a restriction unit that restricts driving of the switching element, if the judgment unit judges that the abnormality occurs;
   the detection unit includes a constant current source that is located at the outside of the integrated circuit, and a temperature sense diode that is located in the vicinity of the switching element; and
   the judgment unit judges that an abnormality occurs in the switching element, if an anode voltage of the temperature sense diode is a predetermined threshold voltage or less.

2. A drive method for driving a switching element, comprising:
   detecting, at a detection unit, a state of a switching element targeted for being driven and outputs a voltage signal corresponding to a detection result of the state;
   receiving, at an integrated circuit, the voltage signal via an input terminal including at least two input terminals that are connected to each other so as to receive the same voltage signal from the detection unit; and
   controlling, by the integrated circuit, the switching element based on the received voltage signal, wherein:
   the integrated circuit includes:
      a judgment unit that judges whether or not an abnormality of driving of the switching element occurs based on the same voltage single inputted via the at least two input terminals; and
      a restriction unit that restricts driving of the switching element, if the judgment unit judges that the abnormality occurs;
   the detection unit includes a constant current source that is located at the outside of the integrated circuit, and a temperature sense diode that is located in the vicinity of the switching element; and
   the judgment unit judges that an abnormality occurs in the switching element, if an anode voltage of the temperature sense diode is a predetermined threshold voltage or less.

3. A power conversion circuit, comprising:
   a switching element; and
   a drive circuit that drives the switching elements, wherein
   the drive circuit includes:
   a detection unit that detects a state of a controlled switching element targeted for being driven and outputs a voltage signal corresponding to a detection result of the state; and
   an integrated circuit that receives the voltage signal via an input terminal for the detection result and controls the switching element based on the received voltage signal, the input terminal including at least two input terminals that are connected to each other so as to receive the same voltage signal from the detection unit, wherein:
   the integrated circuit includes:
      a judgment unit that judges whether or not an abnormality of driving of the switching element occurs based on the same voltage single inputted via the at least two input terminals; and
      a restriction unit that restricts driving of the switching element, if the judgment unit judges that the abnormality occurs;
   the detection unit includes a constant current source that is located at the outside of the integrated circuit, and a temperature sense diode that is located in the vicinity of the switching element; and
   the judgment unit judges that an abnormality occurs in the switching element, if an anode voltage of the temperature sense diode is a predetermined threshold voltage or less.

4. A motor system for a vehicle, comprising:
   a motor generator that is a main machine mounted on the vehicle;
   a battery that supplies a direct current (DC) voltage; and
   a power conversion circuit that converts the DC voltage from the battery to an alternating current (AC) voltage and supplies the AC voltage to the motor generator, which includes a switching element and a drive circuit that drives the switching elements, wherein
   the drive circuit includes:
   a detection unit that detects a state of a switching element targeted for being driven and outputs a voltage signal corresponding to a detection result of the state; and
   an integrated circuit that receives the voltage signal via an input terminal for the detection result and performs drive control of the switching element based on the received voltage signal, the input terminal including at least two input terminals that are connected to each other so as to receive the same voltage signal from the detection unit,
   wherein the at least two input terminals receiving the same voltage signal have the same potential that is voltage divided by resistors,
   the integrated circuit includes:
      a judgment unit that judges whether or not an abnormality of driving of the switching element occurs based on the same voltage single inputted via the at least two input terminals; and
      a restriction unit that restricts driving of the switching element, if the judgment unit judges that the abnormality occurs;
   the detection unit includes a constant current source that is located at the outside of the integrated circuit, and a temperature sense diode that is located in the vicinity of the switching element; and
   the judgment unit judges that an abnormality occurs in the switching element, if an anode voltage of the temperature sense diode is a predetermined threshold voltage or less.

5. The motor system according to claim 4, wherein
   the power conversion circuit includes:
   a converter that converts the DC voltage from the battery to a predetermined DC voltage under drive control of the switching element through the drive circuit; and
   an inverter that converts the predetermined DC voltage from the converter to the AC voltage under control of the switching element through the drive circuit.

* * * * *